(12) United States Patent
Vendrame et al.

(10) Patent No.: US 6,670,229 B2
(45) Date of Patent: Dec. 30, 2003

(54) BIPOLAR TRANSISTOR PRODUCED USING PROCESSES COMPATIBLE WITH THOSE EMPLOYED IN THE MANUFACTURE OF MOS DEVICE

(75) Inventors: Loris Vendrame, Carbonera (IT); Paolo Ghezzi, Rivolta d'Adda (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/077,288

(22) Filed: Feb. 15, 2002

(65) Prior Publication Data

US 2002/0074607 A1 Jun. 20, 2002

Related U.S. Application Data

(62) Division of application No. 09/619,720, filed on Jul. 20, 2000.

(30) Foreign Application Priority Data

Jul. 21, 1999 (EP) .............................. 99830468

(51) Int. Cl.[7] ........................................ H01L 21/8238
(52) U.S. Cl. ........................................ 438/203; 257/370
(58) Field of Search ........................... 438/202–205, 438/369, 380, 372–375, 237, 328, 91, 207, 210; 257/97, 370

(56) References Cited

U.S. PATENT DOCUMENTS

| | | | |
|---|---|---|---|
| 4,879,255 A | 11/1989 | Deguchi et al. ............ 431/59 |
| 5,005,066 A | 4/1991 | Chen ......................... 357/43 |
| 5,011,784 A | * 4/1991 | Ratnakumar ............... 438/203 |
| 5,218,228 A | 6/1993 | Williams et al. ............ 257/593 |
| 5,248,624 A | * 9/1993 | Icel et al. ................... 438/201 |
| 5,605,850 A | 2/1997 | Villa ........................... 437/31 |
| 5,637,516 A | * 6/1997 | Muller ....................... 438/203 |
| 5,837,554 A | 11/1998 | Contiero .................... 437/43 |
| 5,850,101 A | 12/1998 | Iranmanesh ................ 257/565 |
| 5,929,506 A | 7/1999 | Hutter et al. ............... 257/544 |
| 5,940,700 A | * 8/1999 | Galbiati et al. ............ 438/237 |
| 5,952,706 A | 9/1999 | Bashir ....................... 257/587 |
| 5,990,535 A | 11/1999 | Palara ........................ 257/500 |

FOREIGN PATENT DOCUMENTS

| | | |
|---|---|---|
| EP | 0 450 614 A1 | 10/1991 |
| JP | 40-3196669 A | 8/1991 |

OTHER PUBLICATIONS

Anonymous, "Emitter Structure with Different Impurity Concentrations. Jun. 1976." *IBM Technical Disclosure Bulletin*, vol. 19, No. 1, pp. 162–163.

Kwok Ng, "Complete Guide to Semiconductor Devices," 1995, Mc Graw–Hill., Inc., pp. 142–243.

* cited by examiner

*Primary Examiner*—David Nelms
*Assistant Examiner*—David Wu
(74) *Attorney, Agent, or Firm*—Lisa K. Jorgenson; Robert Iannucci; Seed IP Law Group PLLC

(57) ABSTRACT

A bipolar transistor is produced by processes employed in the manufacture of CMOS nonvolatile memory devices, and is part of an integrated circuit. The integrated circuit includes a semiconductor substrate having a first type of conductivity, a PMOS transistor formed in said substrate, an NMOS transistor formed in said substrate, and the bipolar transistor. The bipolar transistor includes: a buried semiconductor layer having a second type of conductivity placed at a prescribed depth from the surface of said bipolar transistor, an isolation semiconductor region having the second type of conductivity, in direct contact with said buried semiconductor layer, and suitable for delimiting a portion of said substrate, forming a base region; an emitter region formed within said base region having the second type of conductivity, a base contact region of said transistor formed within said base region having the first type of conductivity, a collector contact region formed within said isolation semiconductor region having the second type of conductivity, wherein said base region has a doping concentration between $10^{16}$ and $10^{17}$ atoms/cm$^3$.

25 Claims, 4 Drawing Sheets

BIPOLAR TRANSISTOR PRODUCED USING PROCESSES COMPATIBLE WITH THOSE EMPLOYED IN THE MANUFACTURE OF MOS DEVICE

TECHNICAL FIELD

The present invention relates to a bipolar transistor produced by processes employed in the manufacture of CMOS nonvolatile memory devices, and in particular to a circuit comprising a high gain vertical transistor. In addition, it relates to the manufacturing process of a bipolar transistor produced by means of the processes employed in the manufacture of CMOS nonvolatile memory devices.

BACKGROUND OF THE INVENTION

In some circuit applications it is desirable to insert bipolar transistors into CMOS type integrated digital circuits.

Further, for more economical construction of such integrated circuits, it is desirable to have a manufacturing process in which both the bipolar transistors and the CMOS transistors are formed using the same masks and with a minimum number of process phases.

There are known methods for producing bipolar transistors integrated into CMOS circuits at low voltage, using substantially the same process phases. These devices, however, provide very low current gains, usually on the order of a few tens.

SUMMARY OF THE INVENTION

An embodiment of the present invention produces a bipolar transistor with a much higher current gain, using processes commonly employed to manufacture CMOS nonvolatile memories, without adding new process phases.

The bipolar transistor is produced by processes used in the manufacture of nonvolatile memory CMOS devices, and includes: a semiconductor substrate having a first type of conductivity, at least one PMOS transistor formed within said substrate, at least one NMOS transistor formed within said substrate, and a bipolar transistor. The bipolar transistor includes a buried semiconductor layer having a second type of conductivity placed at a prefixed depth from the surface of said bipolar transistor, an isolation semiconductor region having a second type of conductivity, in direct contact with said buried semiconductor layer, and suitable for delimiting a portion of said substrate to form a base region, an emitter region of said transistor formed within said base region, having a second type of conductivity, a base contact region of said transistor formed within said base region, having a first type of conductivity, a collector contact region of said transistor formed within said isolation semiconductor region, having a second type of conductivity, wherein said base region has a doping concentration of between $10^{16}$ and $10^{17}$ atoms/cm$^3$.

An embodiment of the present invention forms a bipolar transistor simultaneously and with the same processes as those used to manufacture nonvolatile memory CMOS devices having a gate region, a source region and a drain region. The method includes: forming a buried semiconductor layer having a second type of conductivity, within a substrate having a first type of conductivity, simultaneously to the formation of a similar layer of buried semiconductor for an N-type CMOS device; forming an isolation semiconductor layer having a second type of conductivity, in direct contact with said semiconductor buried layer, and adapted to delimit a portion of said substrate, forming the base region, simultaneously to the formation of the N-well area of a P-type CMOS device; forming an emitter region and a collector contact region respectively in said base region and in said isolation semiconductor layer, both having a second type of conductivity, simultaneously to the formation a similar semiconductor layer for said source and drain regions of said N-type CMOS devices; and forming a base contact region of said transistor in said base region, having a first type of conductivity, simultaneously to the formation of a similar layer of semiconductor for said source and drain regions of said P-type CMOS devices.

Thanks to the present invention it is possible to realize a high gain bipolar transistor using substantially the same process phases as those used for high voltage CMOS devices, particularly those used in circuits for nonvolatile memories.

BRIEF DESCRIPTION OF THE DRAWINGS

The characteristics and the advantages of the present invention will be evident from the following detailed description of one of its forms of practical realization, illustrated as example not limitative in the joined figures, in which.

DETAILED DESCRIPTION OF THE INVENTION

In devices that include programmable and erasable memory matrix cells, it is always necessary to internally manage the required voltages needed to program and erase the memory cells. In general, these voltages are greater than the necessary working voltages of the logic circuits of the devices. In devices with cells of nonvolatile memory, there are present simultaneously circuits at low voltage and circuits that must manage negative voltages and/or high voltages needed to program and erase the memory cells per se. For example, in the current generation of devices, the working voltage of the logic circuits is 3.3V, while voltages on the order of 10V are required to program the memory cells.

In devices with nonvolatile memory matrixes, it is necessary to build circuits comprised of elements able to bear the operative voltages needed to program and erase the elementary memory cells. To guarantee the working of the CMOS memory circuits at high voltage, without damage to the low voltage logic circuits, regions of substrate are normally created (both of N type and of P type) with doping concentrations inferior to those of the substrate in which low voltage circuits are normally formed. For example, the doping concentrations for the semiconductors at low voltage range between $10^{18}$ and $10^{21}$ impurity/cm$^3$, while the concentrations of doping for the semiconductors at high voltage range between $10^{15}$ and $10^{17}$ impurity/cm$^3$.

Figure 1:
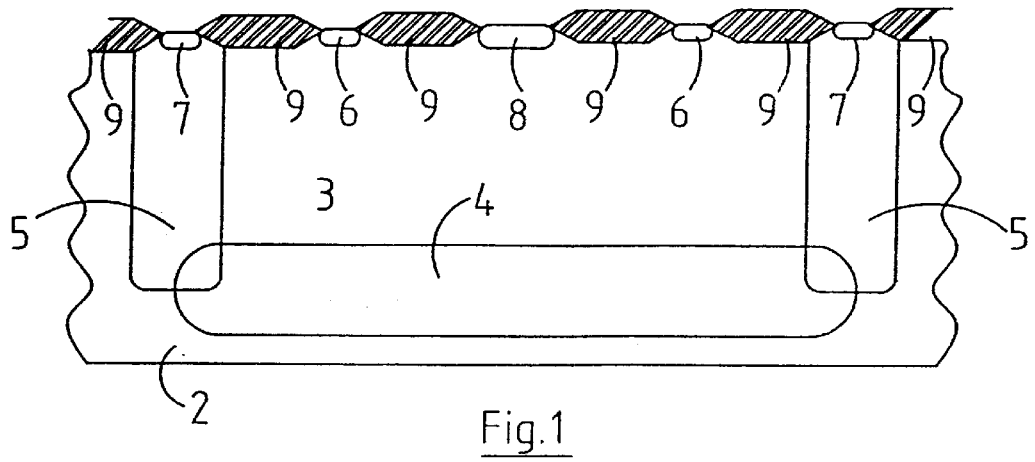
FIG. 1 shows a cross section of an NPN transistor, according to a first embodiment of the present invention.

A first embodiment of the present invention is shown in FIG. 1.

The transistor 1 is formed on a semiconductor substrate 2 doped with a prefixed dose of a first type doping, for example of P-type.

Within the substrate 2 is formed a buried layer 4 doped with a prefixed dose of a second type doping, for example of type n. The layer 4 is obtained by an implantation phase, preferably of phosphor, at high energy.

With the aim of insulating the region 3 from the substrate 2 some insulating regions 5 doped with a prefixed dose of a second type doping are created, for example of N-type. Such regions, starting from the surface of the transistor 1, extend in depth to contact the buried layer 4. The isolating regions 5 constitute with the buried layer 4 the collector region. The region 3 comprises the base region.

Inside region 3, the regions that represent the emitter (which coincides with the emitter contact region) 8 and the base contact region 6 are formed, strongly doped respectively of type N and P.

Inside the isolation regions 5, the region that represents the contact of collector 7 is formed, strongly doped of N-type.

The contact regions of base 6, of collector contact 7 and the emitter region 8 are formed on the surface of the layer 3 and are isolated in between by areas of field oxide 9.

Figure 2:
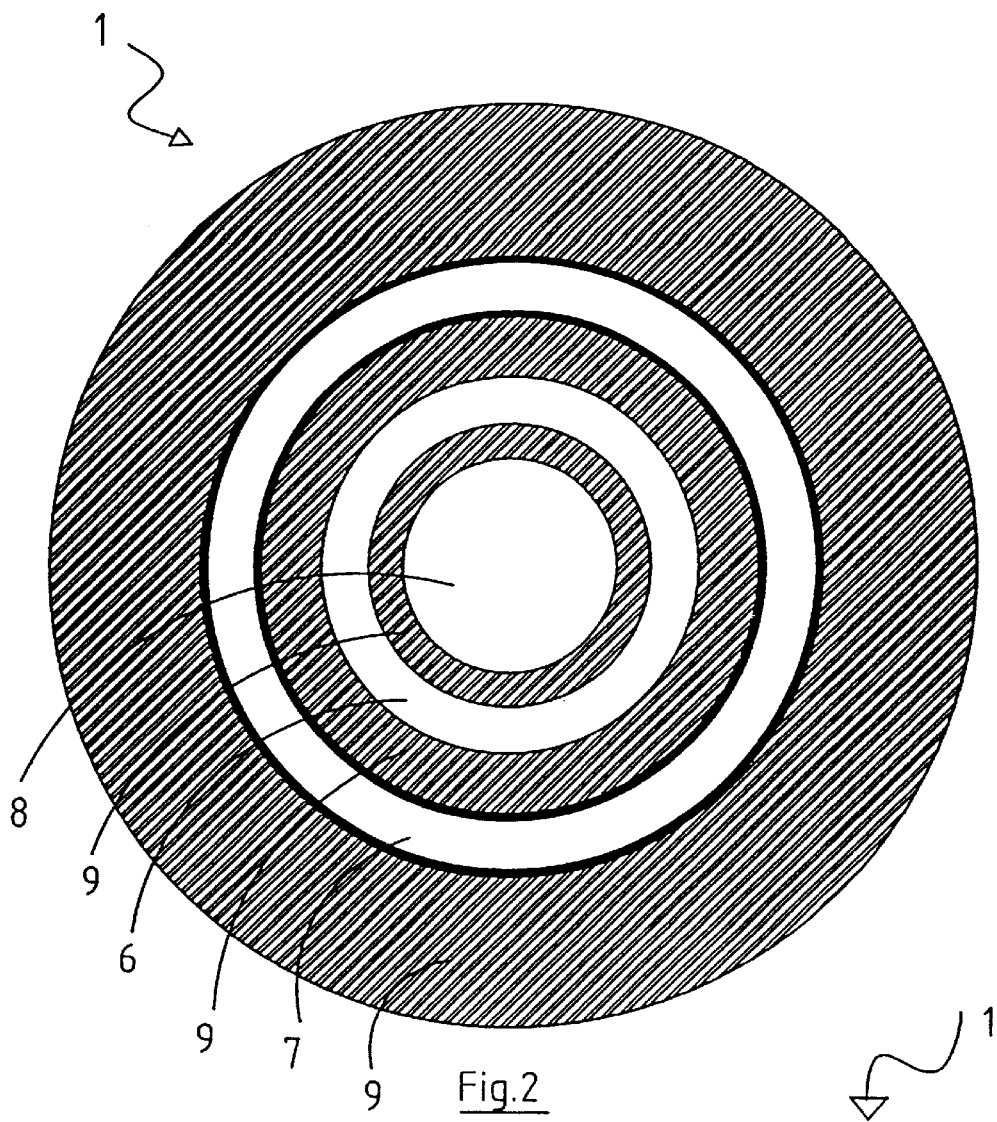
FIG. 2 shows a plan view of the NPN transistor of FIG. 1.

A preferred embodiment of the transistor 1 is the circular one represented in FIG. 2, which shows a plan view of the transistor 1. The region 5 forms in this way a circular enclosure which limits laterally the base region 3; the buried layer 4 limits the base region 3 from the rest of substrate 2. The collector contact region 7, the base contact region 6, and the areas of field oxide 9 form concentric rings on the surface of transistor 1.

Other forms are also possible, for example octagonal and quadrangular.

Figure 4:
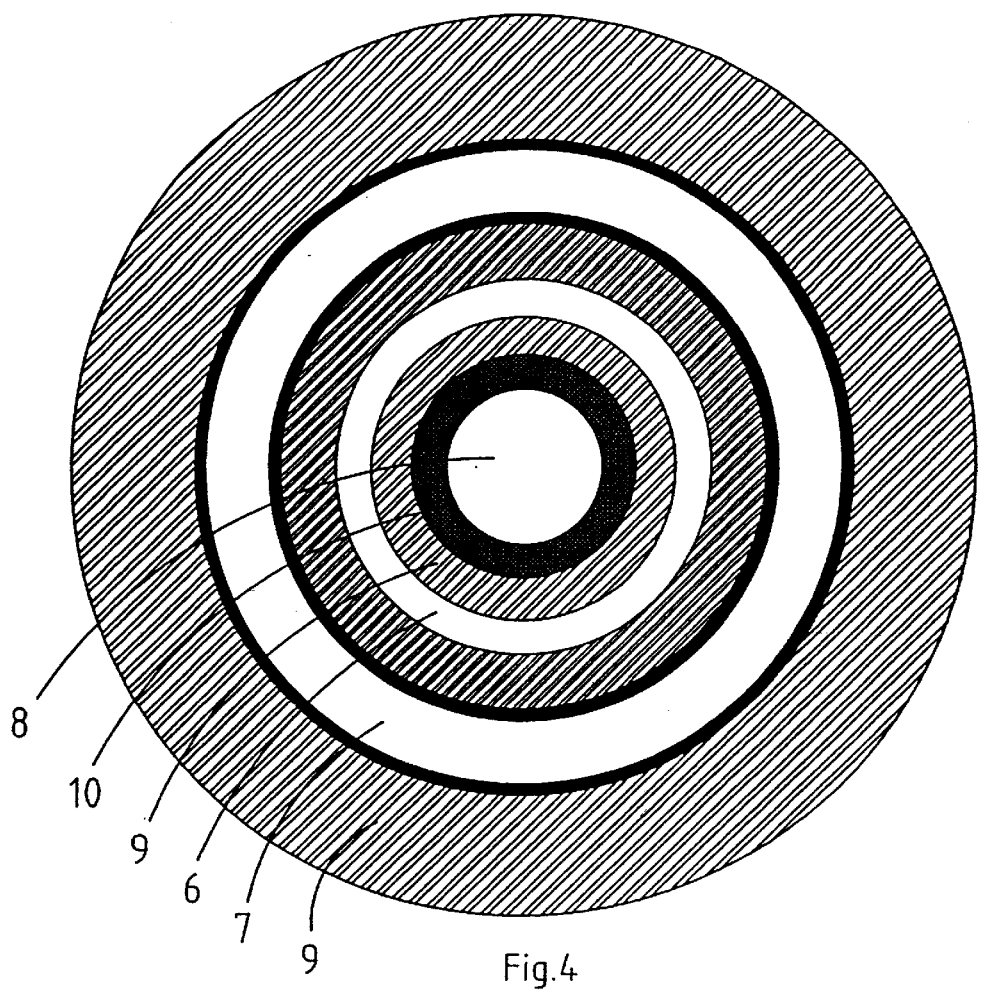
FIG. 4 shows a plan view of the NPN transistor FIG. 3.
Figure 3:
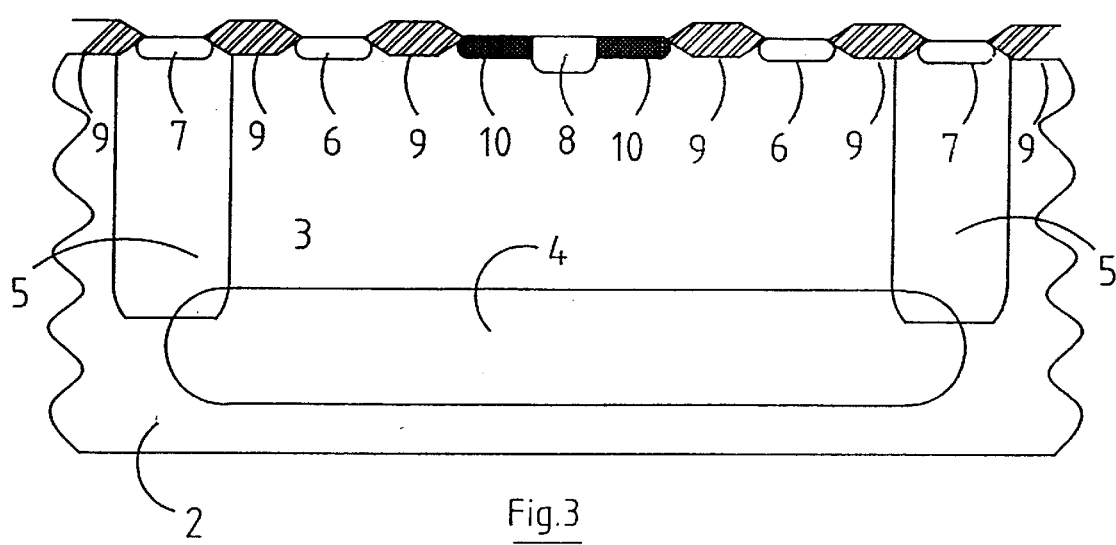
FIG. 3 shows a cross section of an NPN transistor, according to a second embodiment of the present invention.

The cross section of FIG. 3 and the relevant plan view of FIG. 4, represent a second embodiment of the present invention, differing from the first embodiment, shown in FIGS. 1 and 2, by further including a semiconductor region 10, which corresponds to the active region of the emitter, preferably of circular form, which surrounds the contact region of emitter 8. The region 10 is lightly doped with a prefixed dose of a second type doping, for example of N-type, and is of the type used in MOS transistors called "drain extension" or "drex".

The peculiarity of the transistor of FIG. 1 and of FIG. 3 is that of utilizing a region 3, called "ip-well", substantially equal to that utilized simultaneously for the formation on the same wafer of a similar layer for the high voltage CMOS transistors. The doping concentration of the isolating region 5 and of the buried layer 4 is on the order of $10^{17}$ atoms/cm$^3$, (between $10^{17}$ and $10^{18}$ atoms/cm$^3$).

The base contact region 6, the emitter region 8, and the collector contact region 7, have doping concentrations of between $10^{20}$ and $10^{21}$ atoms/cm$^3$.

Regarding the transistor of FIG. 3, region 10 has a doping concentration of between $10^{17}$ and $10^{18}$ atoms/cm$^3$.

Note that all the process phases utilized for the formation of a bipolar transistor 1 are the same and are executed simultaneously to those for the formation on the same substrate of similar structures of CMOS transistors in non-volatile memories, without modifying the building process and without adding further process phases.

Preferably the transistor 1 is a vertical transistor, which has better performances when compared to a lateral transistor. In particular, the distance between the emitter region 8 and the buried layer 4 (which corresponds to the thickness of region 3) is less than the distance between the emitter region 8 and the isolating region 5. The transistor of FIG. 3 has the distance between the emitter region 10 and the buried layer 4 less than the distance between the emitter region 10 and the isolating region 5.

Since the gain of a vertical bipolar transistor is inversely proportionate to the base doping, the vertical bipolar transistor formed in a P-well at high voltage yields a higher gain compared to the same component formed in a P-well at low voltage.

For the purposes of the present invention, low voltage means a voltage lower than 5V and high voltage, a voltage greater than 5V.

Referring now to the embodiment of FIG. 3, note that the active region of the emitter 10 interfaces the field oxide 9 not with high doping doses as in FIG. 1, but with a doping dose typical of the transistor called "drain extension". In such a way, the contact emitter area 8 (defined by the n+high doping implanting of source and drain of the CMOS devices) doesn't interface directly the field oxide 9. The quality of the device is improved if the doping dose of the area in contact with the field oxide 9 is as low as possible.

In fact, this zone is notoriously a stressed region, and it presents numerous imperfections that tend to decrease the gain in the bipolar devices. With the solution proposed here, such inconveniences are eliminated and a higher transistor gain is obtained.

Figure 5:
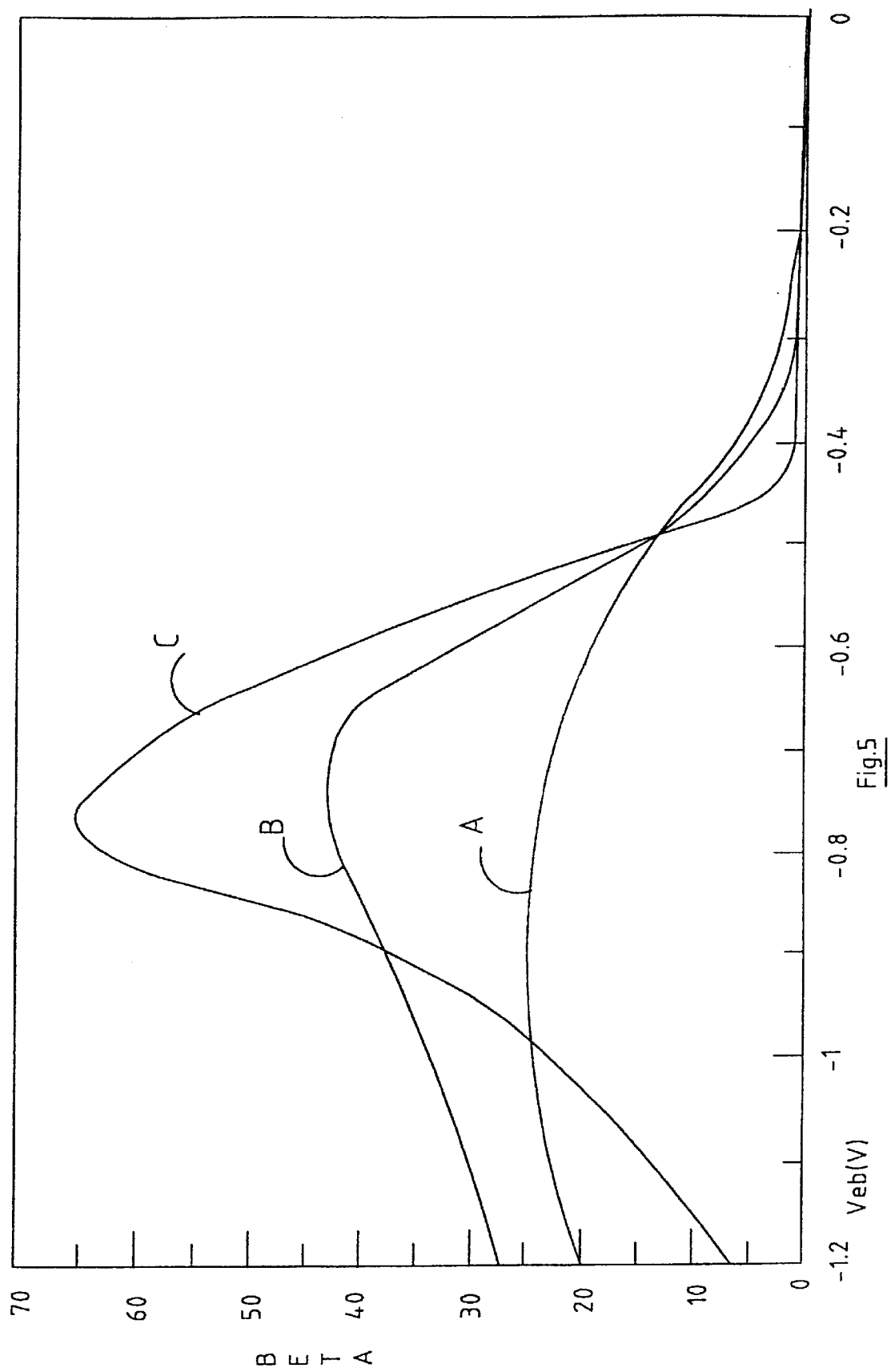
FIG. 5 graphs the trend of the current gain of a transistor of the known art and of two transistors according to the two transistor embodiments according to the present invention.

FIG. 5 is a graph which represents the trend of the gain current (Beta) of the transistor relative to the voltage between emitter and base (Veb).

Curve A represents a transistor according to known art, using a low voltage type ip-well semiconductor layer 3.

Curve B represents a transistor according to the first embodiment of the present invention, which has a high voltage type ip-well semiconductor layer 3.

Curve C represents a transistor according to the second embodiment of the present invention, which has a high voltage type ip-well semiconductor layer 3 and also includes the lightly doped layer 10.

Note that the gain (with Vbe between 0.6 and 0.8V) in the case of curve A barely overcomes a value of 20. In the case of curve B, the gain exceeds 40, and in the case of curve C the gain exceeds 60 or 65.

Note also, that such results have been obtained using only the process phases used in the manufacture of a CMOS nonvolatile memory circuit, without the addition of new phases. The buried layer 4 is the same as that simultaneously formed on the same wafer to form an analogous isolating layer from the substrate of a NMOS transistor. The isolation regions 5 are the same as that formed simultaneously to form the N-well area of the PMOS devices. The base contact region 6 is formed simultaneously to the source and drain regions of a PMOS transistor. The emitter and collector contact regions 8 and 7 are formed simultaneously to the source and drain regions of an NMOS transistor.

Figure 6:
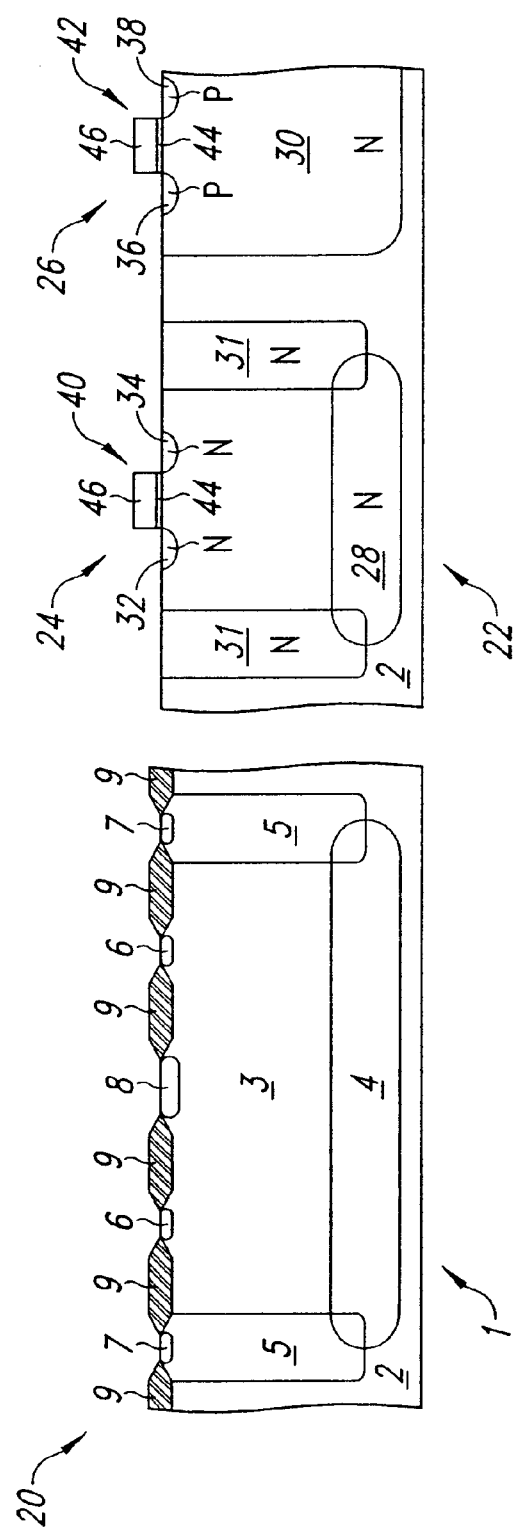
FIG. 6 shows a cross-section of an integrated circuit that includes an NPN transistor and CMOS transistors according to an embodiment of the present invention.

Shown in FIG. 6 is an integrated circuit 20 that includes a CMOS memory device 22 that includes an NMOS transistor 24 and a PMOS transistor 26 in addition to the NPN transistor 1. The NMOS transistor 24 includes an isolating buried layer 28 formed by N-type doping the substrate 2 simultaneously with the formation of the buried layer 4 of the NPN transistor 1. The PMOS transistor 26 includes an N-well 30 formed simultaneously with the isolation regions 5 of the NPN transistor 1. The NMOS transistor 24 also includes drain 32 and source 34 regions that are formed simultaneously with a pair of isolation regions 31 and with the collector 7 and emitter 8 regions of the NPN transistor. The PMOS transistor 26 also includes source 36 and drain 38 regions that are formed simultaneously with the base regions 6 of the NPN transistor 1. The NMOS and PMOS transistors 24, 26 also include respective gates 40, 42 each including a thin insulating layer 44 and a conductive layer 46.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of manufacturing a bipolar transistor using the same process phases, as those used to produce a CMOS nonvolatile memory devices that include an N-type CMOS device and a P-type CMOS device, the method comprising:
   forming a semiconductor buried layer, having a second type of conductivity, in a substrate having a first type of conductivity, simultaneously to the formation of a similar layer of buried semiconductor for said N-type CMOS device;
   forming an isolator semiconductor layer, having a second type of conductivity, in direct contact with said semiconductor buried layer and structured to delimit a portion of said substrate, thereby forming the base region simultaneously to the formation of an N-well area of said P-type CMOS device;
   forming an emitter region and a collector contact region respectively in said base region and in said isolation semiconductor layer having a second type of conductivity, simultaneously to the formation of a similar semiconductor layer for source and drain regions of said N-type CMOS device; and
   forming a base contact region of said transistor in said base region having a first type of conductivity, simultaneously to the formation of a similar layer of semiconductor for source and drain regions of said P-type CMOS device.

2. The manufacturing process according to claim 1 wherein said CMOS devices are high voltage devices.

3. A method comprising:
   providing a substrate with a first conductivity type;
   using a first process to form a buried layer having a second conductivity type in the substrate;
   using a second process to form an isolation layer having the second conductivity type in the substrate to directly contact the buried layer and to delimit a portion of the substrate as a base region to be used for a bipolar transistor;
   using a third process to form a first region having the second conductivity type in the base region of the bipolar transistor;
   using the third process to form a second region having the second conductivity type in a portion of the substrate to be used for a CMOS device of the second conductivity type;
   using a fourth process to form a third region having the first conductivity type in the base region of the bipolar transistor;
   using the fourth process to form a fourth region having the first conductivity type in a portion of the substrate to be used for a CMOS device of the first conductivity type; and
   using the first process to form a buried layer in a portion of the substrate to delimit a portion of a base region for one of the CMOS devices.

4. The method of claim 3 wherein the first conductivity type is P type and the second conductivity type is N type.

5. The method of claim 3 wherein the CMOS devices have working voltages greater than 5 volts.

6. The method of claim 3, further including using the second process to form a well area for the CMOS device of the first conductivity type.

7. The method of claim 3 wherein the second region is a source region.

8. The method of claim 3 wherein the third region is a base contact region.

9. The method of claim 3 wherein the fourth region is a drain region.

10. The method of claim 3 wherein the isolation layer is so formed to laterally limit and the buried layer is so formed to vertically limit the base region from the substrate.

11. The method of claim 3 wherein the isolation layer is so formed to circularly, octagonally, or quadrangularly surround the base region.

12. The method of claim 3 wherein the isolation layer and the buried layer are so formed to have a doping concentration at least an order of magnitude lower than the doping concentration of the first region.

13. The method of claim 3 wherein the isolation layer, the buried layer, and the first region are so formed such that the distance between the first region and the buried layer is less than the distance between the first region and the isolation layer.

14. The method of claim 3, further including using the third process to form a collector contact region in the isolation layer.

15. The method of claim 14 wherein the collector contact region laterally completely surrounds the third region and the third region laterally completely surrounds the first region.

16. The method of claim 3 wherein the first region is an emitter contact region.

17. The method of claim 16, further including using a fifth process to form an emitter active region to surround the emitter contact region, the emitter active region having an doping concentration at least an order of magnitude lower than the doping concentration of the emitter contact region.

18. A method comprising:
   providing a substrate with a first conductivity type;
   using a first process to form a buried layer having a second conductivity type in the substrate;
   using a second process to form an isolation layer having the second conductivity type in the substrate to directly contact the buried layer and to delimit a portion of the substrate as a base region to be used for a bipolar transistor;
   using a third process to form a first region having the second conductivity type in the base region of the bipolar transistor;
   using the third process to form a second region having the second conductivity type in a portion of the substrate to be used for a CMOS device of the second conductivity type;
   using a fourth process to form a third region having the first conductivity type in the base region of the bipolar transistor;
   using the fourth process to form a fourth region having the first conductivity type in a portion of the substrate to be used for a CMOS device of the first conductivity type; and using the second process to form a well area for the CMOS device of the first conductivity type.

19. The method of claim 18, wherein the isolation layer is so formed to laterally limit and the buried layer is so formed to vertically limit the base region from the substrate.

20. The method of claim 18 wherein the isolation layer is so formed to laterally completely surround the base region.

21. The method of claim 18 wherein the isolation layer and the buried layer are so formed to have a doping concentration at least an order of magnitude lower than the doping concentration of the first region.

22. The method of claim 18 wherein the isolation layer, the buried layer, and the first region are so formed such that the distance between the first region and the buried layer is less than the distance between the first region and the isolation layer.

23. The method of claim 18, further including using the third process to form a collector contact region in the isolation layer.

24. The method of claim 18 wherein the collector contact region laterally completely surrounds the third region and the third region laterally completely surrounds the first region.

25. The method of claim 18, further including using a fifth process to form an emitter active region to surround the first region, the emitter active region having an doping concentration at least an order of magnitude lower than the doping concentration of the first region.

* * * * *

UNITED STATES PATENT AND TRADEMARK OFFICE
CERTIFICATE OF CORRECTION

PATENT NO. : 6,670,229 B2
DATED : December 30, 2003
INVENTOR(S) : Loris Vendrame et al.

It is certified that error appears in the above-identified patent and that said Letters Patent is hereby corrected as shown below:

<u>Title page,</u>
Item 54, the title should read: --BIPOLAR TRANSISTOR PRODUCED USING PROCESSES COMPATIBLE WITH THOSE EMPLOYED IN THE MANUFACTURE OF MOS DEVICES --.

<u>Column 5,</u>
Line 26, "forming an isolator" should read as -- forming an isolation --.

Signed and Sealed this

First Day of June, 2004

JON W. DUDAS
*Acting Director of the United States Patent and Trademark Office*